(12) United States Patent
Brown et al.

(10) Patent No.: US 6,408,411 B1
(45) Date of Patent: Jun. 18, 2002

(54) TWO PASS MULTI-STATE PARALLEL TEST FOR SEMICONDUCTOR DEVICE

(75) Inventors: Brian L. Brown; Jackson Leung; Ronald J. Syzdek, all of Sugar Land, TX (US); Pow Cheah Chang, Singapore (SG)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/373,265

(22) Filed: Aug. 12, 1999

Related U.S. Application Data

(60) Provisional application No. 60/096,421, filed on Aug. 13, 1998.

(51) Int. Cl.[7] .............................................. G01R 31/28
(52) U.S. Cl. ....................................... 714/724; 365/201
(58) Field of Search ........................... 714/724; 365/201

(56) References Cited

U.S. PATENT DOCUMENTS 5,475,692 A  * 12/1995  Hatono et al.
5,894,487 A  *  4/1999  Levitan

* cited by examiner

Primary Examiner—Phung M. Chung
(74) Attorney, Agent, or Firm—W. James Brady; Frederick J. Telecky, Jr.

(57) ABSTRACT

A semiconductor memory device (300) having a parallel test circuit is disclosed. A test data path receives parallel I/O line (I/O0–I/O7) values, and generates therefrom test result data values (PASS and DATA_TST). The test result data values (PASS and DATA_TST) are coupled to a two-bit register (312) and output in a sequential fashion to an open drain output driver (314). In this manner, test result data values are provided by driving an output (DQ) in a rapid sequential fashion, rather than placing the output at one of three states (such as logic high state, a logic low state, or a high impedance state).

6 Claims, 9 Drawing Sheets

TWO PASS MULTI-STATE PARALLEL TEST FOR SEMICONDUCTOR DEVICE

This application claims priority under 35 USC §119(e)(1) of provisional application number 60/096,421 filed Aug. 13, 1998.

TECHNICAL FIELD

The present invention relates generally to test circuits for semiconductor devices, and more particularly to circuits that provide internal test results data on the output pins of a semiconductor device.

BACKGROUND OF THE INVENTION

Semiconductor memory devices typically include one or more memory arrays, each of which includes a large number of memory cells. In a standard mode, in response to an applied address, selected memory cells are accessed and given operation is allowed to take place (e.g., a read, write, program or erase operation). The memory cells are usually logically arranged into input/output (I/O) groups in such a way that an applied address will access a memory cell from each I/O group. For example, a memory device may include 128 I/O groups, thus, the applied address would access one memory cell from each of 128 I/O groups. Selected of the 128 memory cells can then be selected depending upon the data width of the memory device. That is, if the memory device has a data width of eight bits, an output data path will be provided to only eight of the 128 bits. Such an arrangement can also allow "prefetch" architectures. In a prefetch architecture, all 128 memory cells would be accessed simultaneously, with data paths being provided sequentially according to the data width of the device. For example, in a read operation for a memory device having a 32-bit data width, data from 128 memory cells would be accessed in a single cycle, and then output, 32-bits at a time, on four consecutive clock cycles.

While semiconductor device manufacturing processes continue to improve, at the same time, dimensions continue to shrink and operating speeds continue to increase. Thus, in an attempt to create smaller and faster devices, manufacturing defects can still occur. In order to ensure that defective devices are not supplied to customers, semiconductor devices are usually tested to ensure their functionality. Many such tests involve writing data into and then reading data from, each of the memory cells within the semiconductor memory device. Due to the considerable number of memory cells within a semiconductor memory device, if such tests are undertaken using conventional access operations, a large amount of time is required to test each memory cell in the memory device.

In order to reduce the amount of time required to test a semiconductor memory device, many memory devices include "on-chip" test circuits. That is, rather than have test equipment generate all of the possible addresses and compare the resulting data with test data, circuits on the memory device itself can test memory cells, and provide data outputs reflecting the results of the test. An example of a prior art on-chip test arrangement for a semiconductor memory device is set forth in FIG. 1.

Referring now to FIG. 1, a prior art semiconductor memory device having an on-chip test circuit is designated by the general reference character 100. The memory device 100 is shown to include a corearray 102 which has a number of memory cells arranged into one or more arrays. The prior art memory device 100 of FIG. 1 is a synchronous dynamic random access memory (DRAM), and so receives conventional input signals, including a system clock signal (CLK), a row address strobe signal (RAS_), a column address strobe signal (CAS_), a write enable signal W_, and address signals (ADD). The input signals are received by a command decoder 104. The command decoder 104 generates internal control signals, including an internal row address strobe signal (INT_RAS), an internal column address strobe signal (INT_CAS), and internal address signals (INT_ADD). In addition, the command decoder 104 generates a test mode signal (TEST_MODE), an output enable signal (OE0), and an internal clock signal (INT_CLK).

According to the applied control signals, the corearray 102 provides access to selected memory cells by way of a number of data I/O lines (I/O0–I/O7). In the arrangement of FIG. 1, particular memory cells are accessed by the INT_ADD signals according to timing established by the INT_RAS and INT_CAS signals. The data I/O lines (I/O0–I/O7) are coupled to a standard data path 106 and a test data path 108. To avoid unduly cluttering the view of FIG. 1, the standard data path 106 illustrates the data path for line I/O0 only. The standard data path 106 is shown to include a data state circuit 110. The data state circuit 110 receives a standard enable signal STD_EN signal and the I/O0 line as inputs, and provides a standard data signal output DATA_STD. When the OE0 signal is high, the data state circuit 110 drives its output DATA_STD according to the I/O0 line signal. When the STD_EN signal is low, the date state driver is placed in a high impedance (hi-Z) state.

The output of the data state circuit 110 is connected to the input of a complementary metal-oxide-semiconductor (CMOS) transfer gate 112. The transfer gate 112, when enabled, provides a data input (DATA) to an output driver circuit 114. The transfer gate 112 is enabled by a READ_CLK signal, and its complement, READ_CLK_.

The output driver circuit 114 also receives a driver output enable signal (OE). When the OE signal is high, the output driver circuit 114 drives a data output (DQ) according to the value of the DATA signal. When the OE signal is low, the output driver circuit 114 is placed in a hi-Z state. The output driver 114 set forth in FIG. 1 is shown to include a CMOS driver stage that includes a p-channel MOS transistor P100 and an n-channel MOS transistor N100. The operation of the two transistors (P100 and N100) is controlled by NAND gate G100, NOR gate G102, and inverter I100. The DATA signal is received as an input to gates G100 and G102, and the OE signal is connected directly to gate G100 as a second input, and by way of inverter I100 as a second input to gate G102. In this arrangement, when the OE signal is low, the output of gate G100 is high and the output of gate G102 is low, resulting in transistors P100 and N100 being turned off. When the OE signal is high, in the event the DATA signal is high, transistor P100 is turned on, and transistor N100 is turned off. In the event the DATA signal is low, transistor P100 is turned off and transistor N100 is turned on.

The STD_EN signal, the READ_CLK and READ_CLK_ signals are provided by a control circuit 116. In a standard mode of operation (such as a read operation), the STD_EN signal is high and the READ_CLK and READ_CLK_ signals will pulse high and low, respectively. Consequently, as data is placed on the I/O0 line, the data state circuit 110 will drive its output according to the logic of line I/O0. Transfer gate 112 will be turned on, resulting in the DATA signal being generated from the logic of line I/O0. The DATA signal will then result in a DQ signal having the same logic as the DATA signal.

The STD_EN, READ_CLK and READ_CLK_ signals are generated by the control circuit 116 in response to the TEST_MODE signal, the OE0 signal, and the INT_CLK signal. The control circuit 116 is shown to include an inverter I102, a three-input AND gate G104, a two-input AND gate G106, and a two input NAND gate G108. The outputs of gates G104 and G106 provide inputs to a two-input OR gate G110. Gate G104 receives the OE0 signal and TEST_MODE signal as inputs, and in addition, receives a pass/fail indication (PASS) from the test data path 108. In a non-test operation (such as a standard read operation), the TEST_MODE signal is low, thus gate G104 provides a low output signal regardless of the state of its other inputs. The TEST_MODE signal is inverted by inverter I102 and applied as one input to gate G106. The other input to gate G106 is the OE0 signal. In this manner, in a non-test mode, gate G106 provides an output that reflects the value of OE0 signal. The output of gate G106 is the STD_EN signal.

The outputs of gates G104 and G106 are further provided as inputs to gate G110. The output of gate G110 is the OE signal. This arrangement results in the OE signal reflecting the OE0 value in a non-test mode.

The OE0 signal is also an input to gate G108. The other input to gate G108 is the INT_CLK signal. The output of gate G108 provides the READ_CLK_ signal, and is further inverted by an inverter I104, to generate the READ_CLK signal. Because the INT_CLK signal is activated (transitions high) in synchronism with the CLK signal, the READ_CLK and READ_CLK_ signals enable the transfer gate 116 in synchronism with the CLK signal (provided the OE0 signal is high).

Having described the operation of the DRAM 100 in a "standard" mode of operation, a parallel test mode of the particular DRAM 100 of FIG. 1 will be described. In the test mode, the standard data path 106 is disabled, preventing the I/O0 line data from reaching the transfer gate 112. In particular, with the TEST_MODE signal high, a low input is provided at gate G106, forcing the output of gate G106 (the STD_EN signal) to be low. The low STD_EN signal results in the data state circuit 110 being placed in the hi-Z state, essentially isolating line I/O0 from the transfer gate 112.

In contrast to the standard data path 106, in the test mode, the test data path 108 provides data to the transfer gate 112. The test data path 108 is shown to include a "compress" circuit 118 that receives all of the I/O lines (I/O0–I/O7) as inputs and provides two compare output signals, CMPB and CMPT, as outputs. The compress circuit 118 "compresses" test data by reducing the output values of lines I/O0–I/O7 into the two signals CMPB and CMPT. This is accomplished by comparing the data of lines I/O0–I/O7 to predetermined values. In particular, in the case of FIG. 1, in the event all of the lines I/O0–I/O7 are low, the CMPT signal will be high and the CMPB signal will be low. Conversely, in the event all of the lines I/O0–I/O7 are high, the CMPT signal will be low, and the CMPB signal will be high. The compress circuit 118 will also indicate if a test fail condition exists (i.e., all the I/O lines are not at the same logic value). In such a case, the CMPT and CMPB signals will both be high.

Within the test data path 108, the CMPT and CMPB signals are received by a test data state circuit 120 and a pass/fail circuit 122. Both the test data state circuit 120 and the pass/fail circuit 122 are enabled by the TEST_MODE signal. When the TEST_MODE signal is low, the test data state circuit 120 and the pass/fail circuit 122 are placed in a hi-Z state. When the TEST_MODE signal is high, the test data state circuit 120 provides a DATA_TST output signal that indicates the logic values of the I/O lines (I/O0–I/O7). In particular, if the I/O lines (I/O0–I/O7) are all high (or the test data indicates a fail condition), the DATA_TST signal will be high. When the I/O lines (I/O0–I/O7) are all low (and no test fail condition exists) the DATA_TST signal will be low.

The pass/fail circuit 122 utilizes the CMPB and CMPT signals to determine if an error condition exists on the I/O lines (I/O0–I/O7). If a pass condition exists, the CMPB or CMPT signals will be at different logic values (successful test data has been received), and the output of the pass/fail circuit 122 (a PASS signal), will be high. Conversely, when the CMPB and CMPT signals are both high (indicating test failure), the PASS signal will be low.

The DATA_TST and PASS signals are used to provide an output data signal (DQ) that reflects the test results. As shown in FIG. 1, the DATA_TST signal is provided as an input to transfer gate 112. Thus, in a test operation, the output driver 114 drives the DQ output according the logic values of all of the I/O lines (I/O0–I/O7), instead of according to the data of line I/O0. At the same time, the PASS signal is applied to the control circuit 116 and is utilized to enable the output driver 114. Accordingly, when the data test is passed (PASS is high), the output driver 114 will be enabled and the output DQ will be driven high in the event all of the I/O lines (I/O0–I/O7) were high, or low in the event all of the I/O lines (I/O0–I/O7) were low. When the data test indicates an erroneous value has been provided on one or more of the I/O lines (I/O0–I/O7) (PASS is low), the output driver 114 will be place in a hi-Z state. As shown in FIG. 1, the PASS signal is provided as an input to gate G104 within the control circuit 116. Thus, when the PASS signal is low, the output of gate G104 is forced low. At the same time, a high TEST_MODE signal causes the output of gate G106 to be forced low. With two low inputs, the output of gate G110 (the OE signal) will be low. The low OE signal as applied to the output driver 114 will place the output driver 114 into the hi-Z state.

Referring now to FIG. 2, a timing diagram is set forth illustrating a test operation according to the DRAM 100 of FIG. 1. At time t0, the DRAM 100 is place into the test mode by a predetermined combination of RAS_, CAS_, W_, and ADD values. As a result, the TEST_MODE signal is driven high. The INT_CLK signal follows the CLK signal. The INT_RAS and INT_CAS signals remain low, as the applied RAS_ and CAS_ signals are not timing signals, but rather mode establishing signals. Because an access operation has not taken place at time t0, the OE0 and OE signals are both low. The low OE0 signal causes the READ_CLK signal to remain low. Because no test data has yet been generated, the PASS and DATA signals are both low.

At time t1, now that the DRAM 100 is in the test mode, a test row address (ADD) is applied in conjunction with a low RAS_ signal. The INT_RAS signal is driven high, resulting in selected memory cells being coupled to bit lines within the corearray 102. The data on the bit lines is then amplified.

At time t2, having successfully generated test data on the bit lines, a test column address (ADD) is applied in conjunction with a low CAS_ signal. The INT_CAS signal is driven high, resulting in selected of the bit lines being coupled to the I/O lines (I/O0–I/O7). The resulting I/O line test data are compared with predetermined data values in the compress circuit 118, and the results (the CMPB and CMPT signals) are provided to the test data state circuit 120 and pass/fail circuit 122.

At time t3, the test data state circuit 120 and pass/fail circuit 122 provide the DATA_TST and PASS values as outputs. As noted previously, the DATA_TST signal will be high or low, depending upon the values of the I/O lines (I/O0–1/O7), and the PASS signal will be high or low, depending upon whether or not the data have passed the test.

At time t4, according to the command decoder 104, the OE0 signal transitions high. This results in the OE and READ_CLK signals going high. The transfer gate 112 is enabled, and if the PASS signal is high (the I/O line data have passed the test) the DQ output will be driven according to the DATA_TST value. If the PASS signal is low the output driver 114 will be in the hi-Z state.

At time t5, a particular combination of RAS_, CAS_, W_ and ADD signals are applied to take the DRAM 100 out of the test mode and back into the standard mode.

In the manner described above, the DRAM 100 provide three DQ states to indicate test results; a high logic value for a successful read of all high values, a low logic value for a successful read of all low values, and a hi-Z state in the event the I/O line data fails the test.

A problem related to the parallel testing arrangement of FIG. 1 arises when different data transmission approaches are used. For example, certain types of system bus arrangements require "open drain" output drivers (as opposed to CMOS output driver of FIG. 1). In a system that requires open drain output drivers, rather than rely on semiconductor device output drivers that drive an output between a high logic level and a low logic level, an open drain output driver drives an output between a low logic state and a hi-Z state. A high logic state is then established by the bus, which includes a terminating resistor connected between the data output and a terminating voltage. When open drain output driver is in the hi-Z state, the terminating resistor will pull the output to the high logic level.

Because the open drain driver provides only two states, instead of three, the parallel test circuit of the prior art in not capable of providing a signal that indicates the test data value read (i.e., high or low) as well as the test results (i.e., pass or fail). In light of the use of open drain drivers in semiconductor memory and other devices, it would be desirable to provide some way of providing test data from a semiconductor device that does not require an output driver having three different states.

SUMMARY OF THE INVENTION

According to the disclosed embodiments a semiconductor memory device includes a parallel data test circuit that generates a pair of test result values. The test result values are provided at an output of the semiconductor memory device. Rather than present the test result data by placing the output at one of three states (i.e., high, low or high impedance), the embodiments drive the output between two states in a sequential fashion according to the test result values.

According to one aspect of the embodiments, the output of the semiconductor memory device is driven by an open drain output driver.

According to another aspect of the embodiments, the output of the semiconductor memory device is driven by a complementary metal-oxide-semiconductor (CMOS) output driver.

According to another aspect of the embodiments, the semiconductor memory device includes a register for storing the test result values.

DETAILED DESCRIPTION OF THE EMBODIMENTS

A first and second embodiment will be described. Both embodiments provide a test mode operation in which the results of a parallel data test are provided by generating two consecutive signals at the same data output. The first embodiment includes an output driver having an "open drain" configuration. The second embodiment includes a complementary metal(conductor)-oxide(insulator)-semiconductor (CMOS) output driver. In both the first and second embodiments, the two consecutive output signals have a first and second logic value, and indicate the logic values of the tested data, as well as whether or not the data have passed or failed the parallel test.

Figure 3:
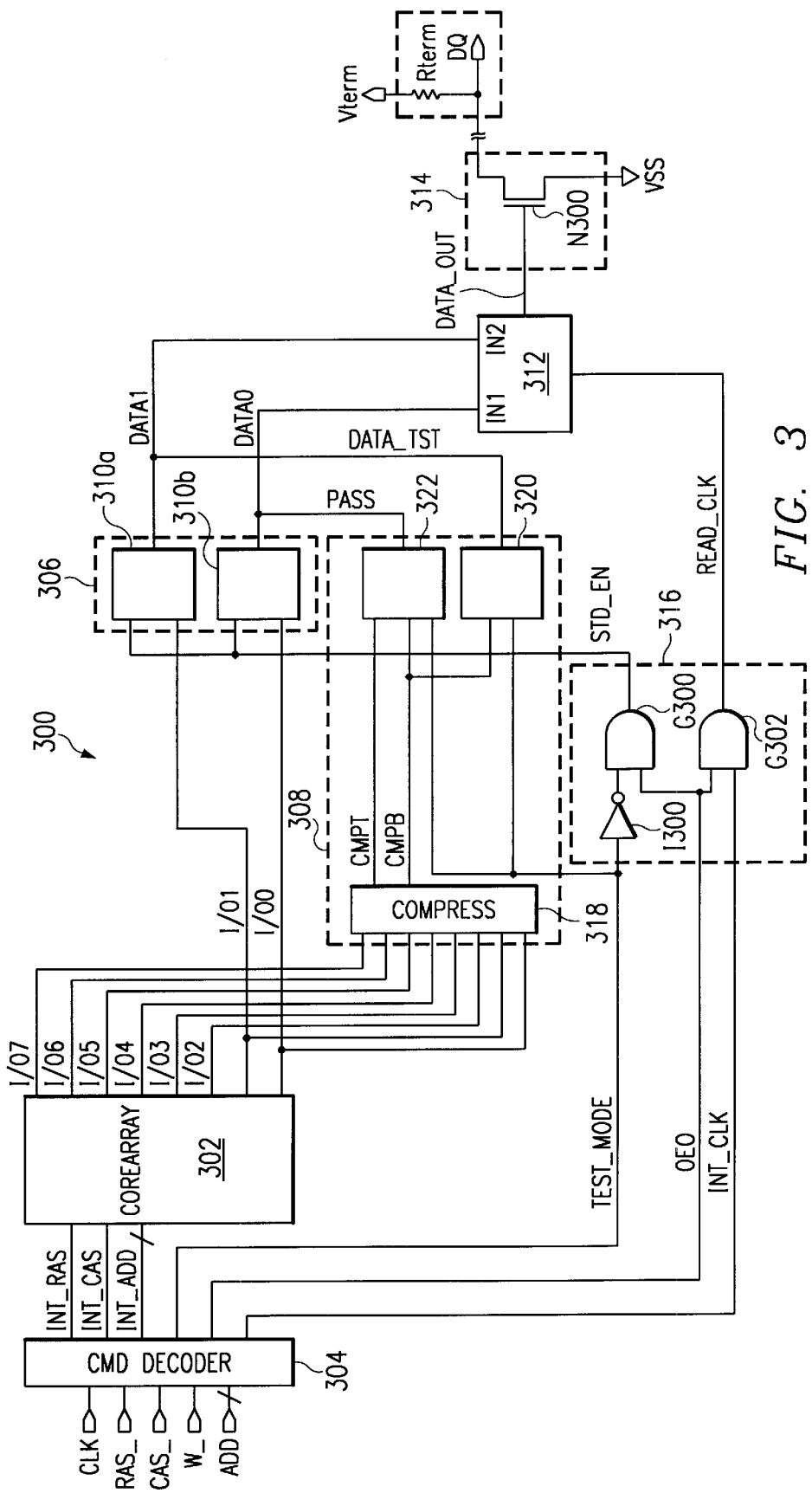
FIG. 3 is a block schematic diagram of a first embodiment.

Referring now to FIG. 3, the first embodiment is set forth in a block schematic diagram. The first embodiment is a dynamic random access memory (DRAM) and is designated by the general reference character 300. The first embodiment 302 includes a corearray 302 having a number of DRAM cells arranged into rows and columns. The DRAM cells are accessed by the application of external control signals. The first embodiment 300 is a synchronous DRAM (SDRAM), and so receives the typical timing and control signals of a SDRAM, including a system clock signal (CLK), a row address strobe signal (RAS_), a column address strobe signal (CAS_), and a write enable signal W_. A memory address (ADD) is applied in conjunction with the timing and control signals to select a given set of DRAM cells within the corearray 302.

The timing and control signals (CLK, RAS_, CAS_ and W_) as well as the address (ADD) are processed by a command decoder 304 to generate a number of internal timing and control signals, and an internal address (INT_ADD). The internal timing and control signals include an internal row address strobe signal (INT_RAS), an internal column address strobe signal (INT_CAS), a test mode signal (TEST_MODE), an output enable signal (OE0), and an internal clock signal (INT_CLK). The corearray 302 functions in a conventional fashion, coupling a row of memory cells to bit lines in response to an active (high) INT_RAS signal and an applied row address (INT_ADD). Selected of the bit lines are then coupled to data I/O lines (I/O0–I/O7) by an active INT_CAS signal and an applied column address (INT_ADD).

The data I/O lines (I/O0–I/O7) are coupled to a standard data path 306 and a test data path 308. For purposes of clarity, the standard data path 306 includes the data path for lines I/O0 and I/O1 only. The standard data path 306 is shown to include a first data state circuit 310a coupled to the I/O0 line, and a second data state circuit 310b coupled to the I/O1 line. Each data state circuit (310a and 310b) receives its respective I/O line (I/O0 or I/O1) as one input, and a standard enable signal STD_EN signal as a second input. When the STD_EN signal is active (high), the first and second data state circuits (310a and 310b) provide first and second data signals (DATA0 and DATA1), that reflect the logic of lines I/O1 and I/O1, respectively. When the STD_EN signal is low, the first and second data state circuits (310a and 310b) are placed in a high impedance (hi-Z) state.

The DATA0 and DATA1 signals are provided as inputs to a two-bit register 312. The two-bit register 312 also receives a READ_CLK signal. The output of the two-bit register 312 is a register output signal DATA_OUT. The two-bit register 312 stores the DATA0 and DATA1 values, and according to the READ_CLK signals, outputs them one after the other to generate the DATA_OUT signal. Thus, the DATA0 and DATA1 signals are received in a parallel fashion, and essentially output in a serial fashion by the two-bit register 312.

The DATA_OUT signal is applied to an open drain output driver stage 314. The open drain output driver 314 is represented in FIG. 3 by a single n-channel MOS transistor (N300), having a drain coupled to the output DQ, a gate that receives the DATA_OUT signal, and a source coupled to a lower power supply voltage (VSS). Also included in FIG. 3 is a representation of the termination arrangement of the data bus. The termination arrangement includes a terminating resistor Rterm that couples the DQ output to a terminating voltage Vterm. It is understood that the terminating arrangement is external to the DRAM in the particular arrangement of FIG. 3. The open drain output driver 314 results in only two possible data states. When the DATA_OUT signal is high, the DQ output is pulled low (to VSS). When the DATA_OUT signal is low, the open drain output driver 314 provides a hi-Z state, allowing the termination arrangement to draw the DQ output toward the Vterm voltage.

In a standard (non-test) read operation, the corearray 302 is accessed by the application of a conventional RAS_, CAS_ and address sequence, resulting in data being placed on lines I/O0–I/O7. The STD_EN signal is driven high, enabling the first and second data state circuits (310a and 310b) and causing the DATA0 and DATA1 values to be driven according to the logic of I/O lines I/O0 and I/O1, respectively. The DATA0 and DATA1 values are stored in the two-bit register 312. Subsequently, the READ_CLK signal pulses high, causing the DATA_OUT signal to be driven first by the DATA0 value, and then by the DATA1 value.

The STD_EN and READ_CLK signals are generated by a control circuit 316 in response to the TEST_MODE signal, the OE0 signal, and the INT_CLK signal. The control circuit 316 is shown to include an inverter I300, a two-input AND gate G300, and another two-input AND gate G302. The TEST_MODE signal is inverted by inverter I300 and applied as one input to gate G300. The other input to gate G300 is the OE0 signal. The resulting output of gate G300 is the STD_EN signal. Gate G302 receives the OE0 signal and INT_CLK signal as inputs, and provides the READ_CLK signal as an output. In the standard mode, the TEST_MODE signal is low; thus the STD_EN signal will pulse high in response to the OE0 signal going high.

Having described the various circuits utilized in a standard read operation, the circuits utilized for a parallel test mode will now be described. In a test mode, the standard data path 306 is disabled, preventing data from lines I/O0 and I/O1 from reaching the two-bit registers 312. In particular, when the TEST_MODE signal goes high, gate G300 will drive the STD_EN signal low. This forces the first and second data state circuits (310a and 310b) into a hi-Z state.

In the test mode, the test data path 308 provides test data to the two-bit register 312, instead I/O line (I/O0 and I/O1) output data. Within the test data path 308, lines I/O0–I/O7 are coupled to a compress circuit 318. In response to the logic of the I/O0–I/O7 logic values, the compress circuit 318 provides two compare output signals CMPB and CMPT. The CMPB and CMPT signals represent the results of a comparison of the data on the I/O lines (I/O0–I/O7) to predetermined logic values. In the first embodiment 300 it is assumed that the I/O lines (I/O0–I/O7) will all provide the same logic value (either high or low) in a test operation. Accordingly, for the compress circuit 318 of FIG. 3, in the event all of the lines I/O0–I/O7 are low, the CMPT signal will be high and the CMPB signal will be low. Conversely, in the event all of the lines I/O0–I/O7 are high, the CMPT signal will be low, and the CMPB signal will be high. Finally, in the event an error condition exists, resulting in a difference in the I/O line (I/O0–I/O7) values, both the CMPB and the CMPT signals will be high.

Referring back to FIG. 3, it is shown that the test data path 308 further includes a test data state circuit 320 and a pass/fail circuit 322. The test data state circuit 320 receives the CMPB signal and the TEST_MODE signal as inputs. The pass/fail circuit 322 receives the CMPT, CMPB and TEST_MODE signals as inputs. Both the test data state circuit 320 and a pass/fail circuit 322 are enabled by the TEST_MODE signal. When the TEST_MODE signal is low, indicating a non-test mode (such as a standard read operation), the test data state circuit 320 and a pass/fail circuit 322 are placed in a hi-Z state. However, when the TEST_MODE signal is high, test data is provided by the test data state circuit 320 and the pass/fail circuit 322. In particular, the test data circuit 320 will provide a DATA_TST signal that reflects the logic values of the I/O lines (I/O0–I/O7). If the I/O lines (I/O0–I/O7) are all high (or the test data indicates a fail condition), the DATA_TST signal will be high. When the I/O lines (I/O0–I/O7) are all low (and no test fail condition exists) the DATA_TST signal will be low. The pass/fail circuit 322 will provide a PASS signal that reflects whether or not the I/O line (I/O0–I/O7) data have passed the test. If the PASS signal is high, the test was successful. If the PASS signal is low, the data have failed the test.

Figure 1:
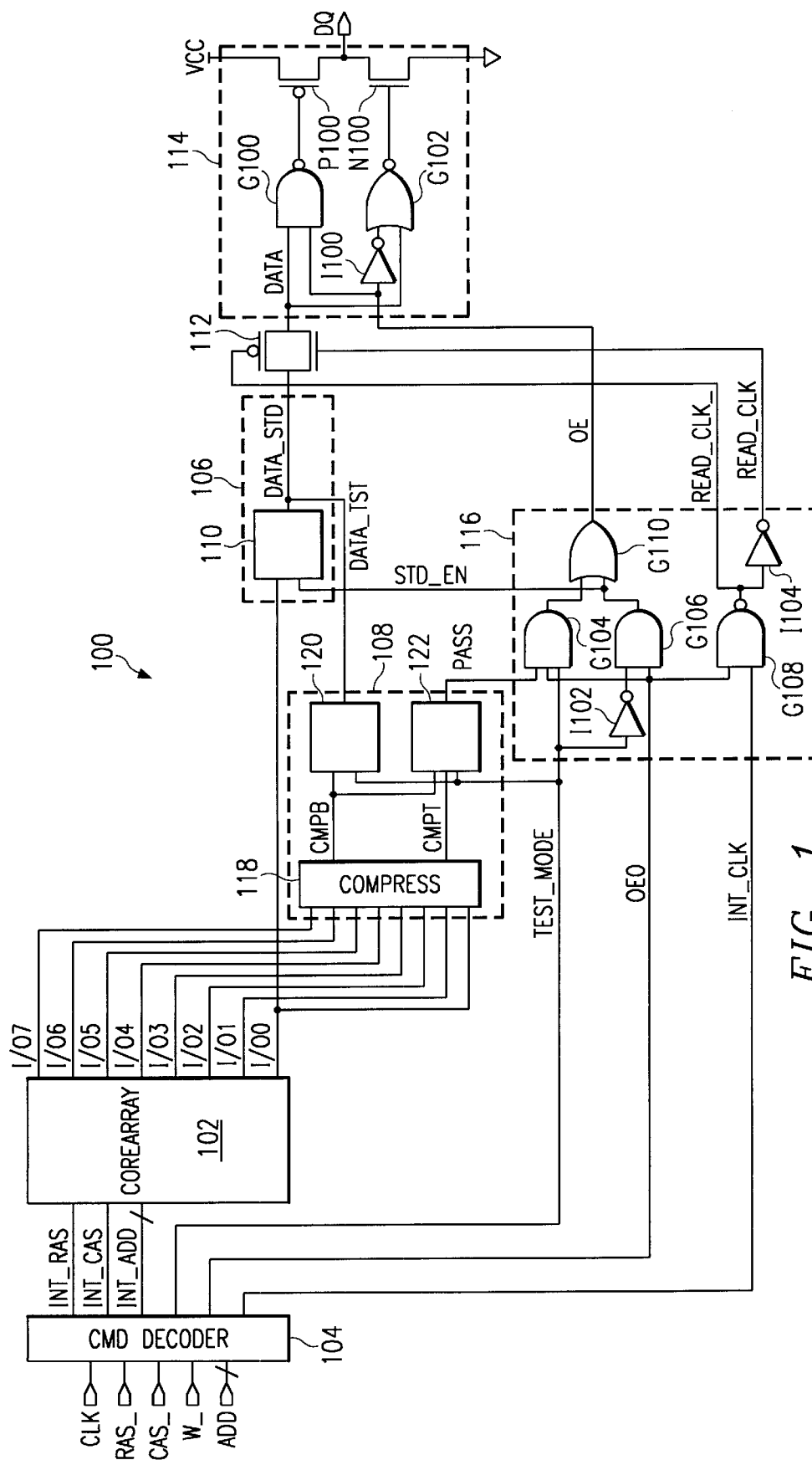
FIG. 1 is a block schematic diagram illustrating a prior art DRAM having a parallel test capability and a CMOS output driver.
Figure 2:
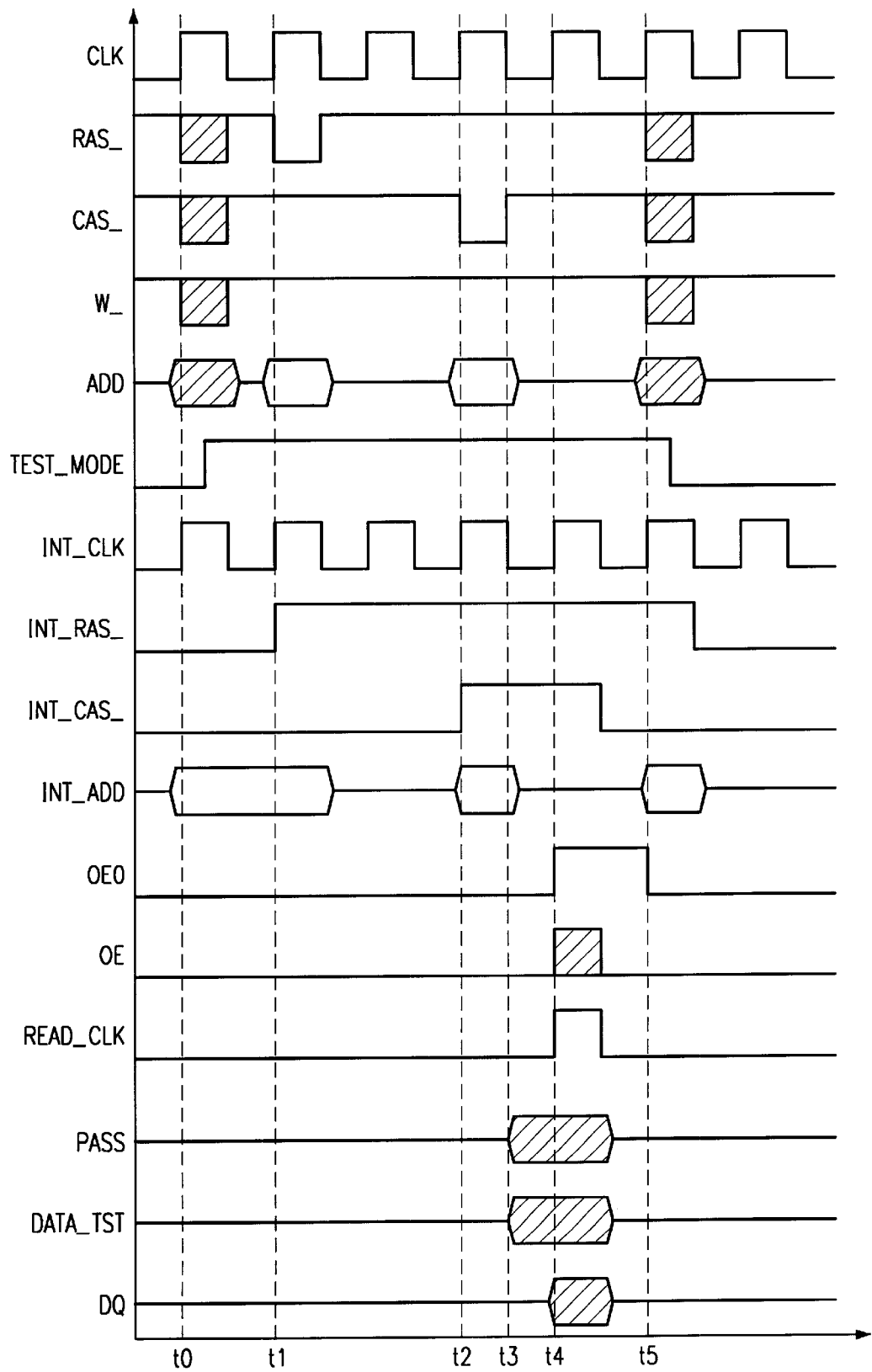
FIG. 2 is a timing diagram illustrating a test operation of the prior art DRAM set forth in FIG. 1.

As shown in FIG. 3, in the test mode, the DATA_TST and PASS values are provided as inputs to the two-bit register 312 in lieu of I/O line data from the first and second data state drivers (310a and 310b). The READ_CLK signal functions in the same fashion as a conventional read operation. Therefore, in the test mode, the open drain output driver 314 will drive the DQ output according to the DATA_TST and PASS values, rather than the I/O0 and I/O1 line values. In this manner, the first embodiment 300 provides two serial test data bits (DATA_TST and PASS) as outputs in the test mode, instead of placing the output into one of three different states, as in the case of the prior art circuit of FIG. 1. The test mode arrangement of FIG. 3 is particularly advantageous as many DRAMs may already include an output register, such as two-bit register 312, for standard data output operations.

Figure 4:
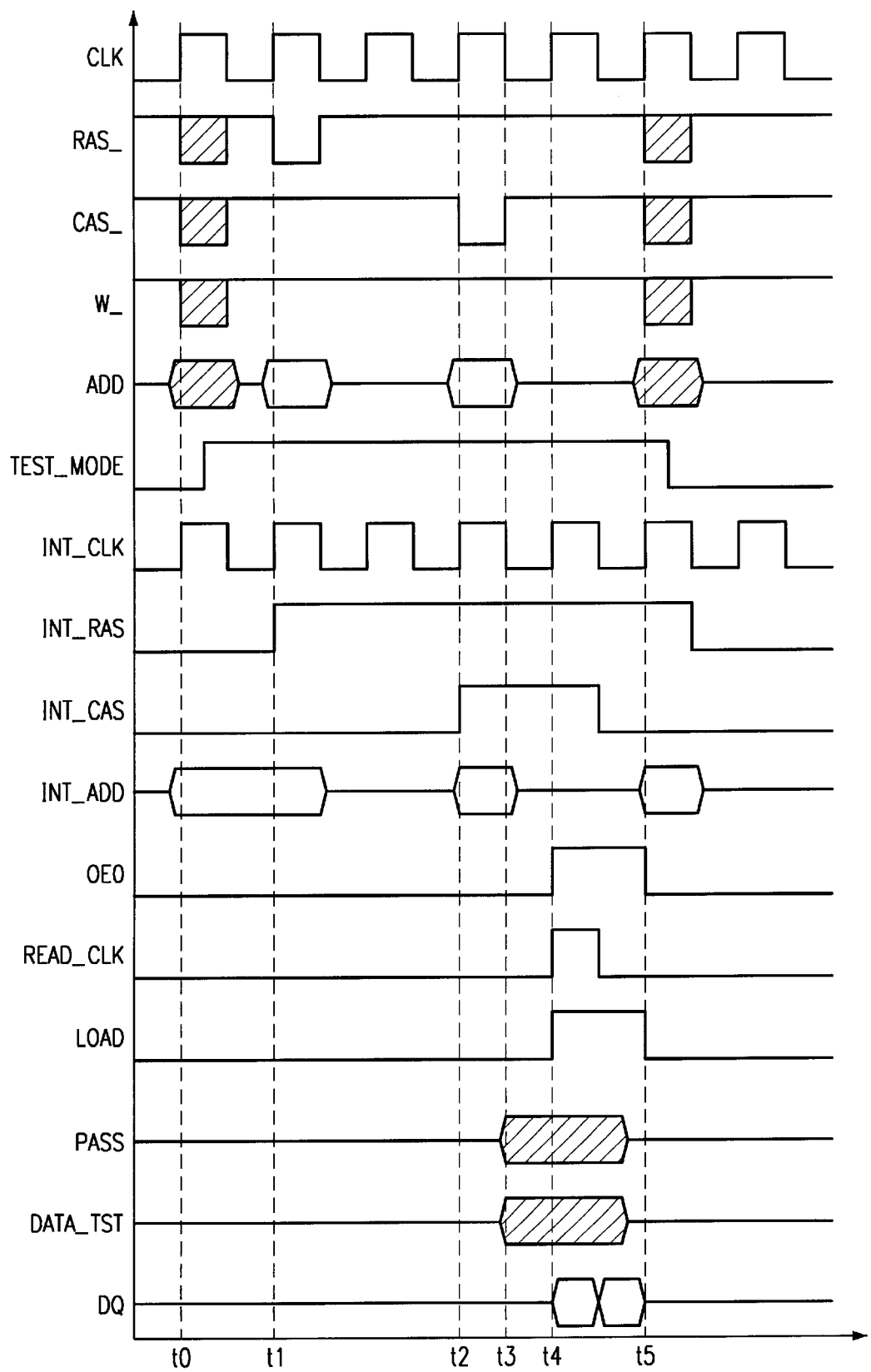
FIG. 4 is a timing diagram illustrating the operation of the first embodiment.

Referring now to FIG. 4, a timing diagram is set forth illustrating a test operation of the first embodiment 300. The timing diagram includes the timing and control signals (CLK, RAS_, CAS_, W_ and ADD) that are applied to the first embodiment 300. The signals provided by the command decoder 304 (INT_RAS, INT_CAS, INT_ADD, TEST_MODE, OE0 and INT_CLK) are also set forth. Additional signals illustrated include the READ_CLK signal provided from the control circuit 316 as well as the PASS and DATA_TST signals from the test data path 308, and the DQ output signal. Finally, FIG. 4 also includes a LOAD signal. In the first embodiment 300, the LOAD signal is a signal internal to the two-bit register 312 that results in the PASS and DATA_TST signals being loaded into the two-bit register 312.

At time t0, a given combination of input signals (RAS_, CAS_, W_ and ADD) is provided to the first embodiment 300 that places it into the test mode. Because the combination can be any of a number of combinations, the RAS_, CAS_, W_ and ADD signals are illustrated with hatching. The combination of signals is interpreted by the command decoder 304, which activates the TEST_MODE signal, forcing it high. The high TEST_MODE signal enables the test data state circuit 320 and pass/fail circuit 322. At the same general time, the high TEST_MODE signal is received by the control circuit 316, which drives the STD_EN signal low. This places the first and second data state circuits (310a and 310b) into the hi-Z state.

With the first embodiment 300 in the test mode, at time t1, a test row address (ADD) is received in conjunction with a low RAS_ signal. The INT_RAS signal is driven high, resulting in a row of memory cells being coupled to bit lines within the corearray 302.

At time t2, a test column address (ADD) is applied in a multiplexed address fashion in conjunction with a low CAS_ signal. The INT_CAS signal is driven high, and selected bit lines, determined by the applied column address, will be coupled to the I/O lines (I/O0–I/O7). The test data on the I/O lines are compared with predetermined data values in the compress circuit 318. According to the comparison results, the compress circuit 318 drives the CMPB and CMPT signals high or low.

At time t3, the DATA_TST and PASS signals are driven according to the results of the data test operation. The DATA_TST and PASS signals are shown with hatching because their values will depend upon the test results.

At time t4, the command decoder 304 drives the OE0 signal high. The high OE0 signal, in combination with a high transition in the INT_CLK signal, results in the READ_CLK signal being driven high. When the READ_CLK signal is driven high, the LOAD signal also goes high, loading the PASS and DATA_TST values into the two-bit register 312. The READ_CLK signal then causes the two-bit register 312 to output two sequential values, the PASS value and then the DATA_TST value.

Because the open drain output driver 314 is essentially an inverting driver (i.e., it inverts the received DATA_OUT value), the two-bit register 312 of FIG. 3 provides inverted output values. In particular, in the event all of the I/O lines (I/O0–I/O7) were high, and the comparison test is passed, two consecutive low values will be output from the two-bit register 312. In the event all of the I/O lines (I/O0–I/O7) were low, and the comparison test is passed, a low value followed by a high value will be output from the two-bit register 312. In the event the comparison test is failed (regardless of the I/O line values), two consecutive high values will be output from the two-bit register 312.

At time t5, another combination of RAS_, CAS_, W_ and ADD signals are applied to the first embodiment 300 that result in the first embodiment 300 being taken out of the test mode and back into the standard mode. As a result, the TEST_MODE signal is driven low. The low TEST_MODE signal places the pass/fail circuit 322 and test data state circuit 320 into a hi-Z state. At the same time, the first and second data state circuit (310a and 310b) are enabled, allowing a subsequent standard read operation to place I/O line data from lines I/O0 and I/O1 into the two-bit register 312.

Figure 5A:
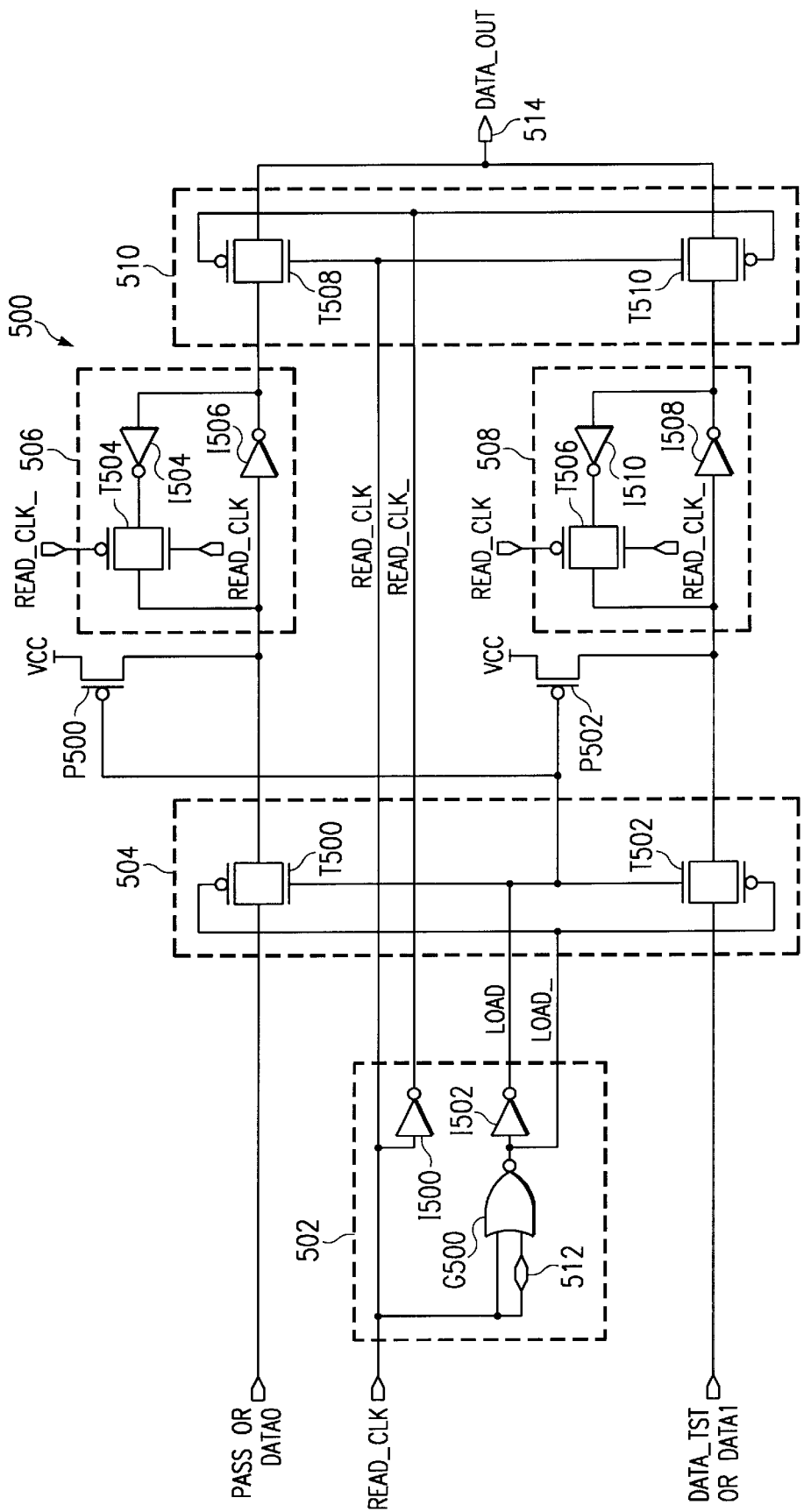
FIG. 5A is a schematic diagram illustrating a two-bit register that may be used in the first embodiment.

Referring now to FIG. 5A, a two-bit register that may used in the first embodiment 300 is set forth in a schematic diagram. The two-bit register is designated by the general reference character 500, and is shown to include a timing circuit 502, a load gate circuit 504, a first bit latch 506, a second bit latch 508, and a phased output gate circuit 510. In addition, the two-bit register 500 also includes two reset p-channel MOS transistors (P500 and P502). The timing circuit 502 provides timing signals to control the various other portions of the two-bit register 500. In the embodiment of FIG. 5A, the timing circuit 502 receives the READ_CLK signal, and inverts the signal with inverter I500 to generate the READ_CLK_ signal. The READ_CLK and READ_CLK_ signals are used to activate the phased output gate circuit 510, as well as the first and second bit latches (506 and 508). In addition, the timing circuit 506 generates the LOAD signal previously described in conjunction with the timing diagram of FIG. 4. The LOAD signal in FIG. 5A is generated by a falling edge delay circuit that includes delay circuit 512 and two-input NOR gate G500. The READ_CLK signal is provided in a non-delayed manner as one input to gate G500, and in a delayed manner to the other input of gate G500. The delay is established by the delay circuit 512. The output of gate G500 is an inverse load data signal LOAD_. The LOAD_ signal is inverted by inverter I502 to generate the LOAD signal. This arrangement results in the LOAD signal having a rising edge that follows the rising edge of the READ_CLK signal, and a falling edge that is delayed with respect to the falling edge of the READ_CLK signal.

The load gate circuit 504 is activated by the LOAD and LOAD_ signals. In the embodiment of FIG. 5A, the load gate circuit 504 includes two CMOS transmission gates T500 and T502. When the LOAD signal is low (and LOAD_ high), the gates T500 and T502 are turned off, preventing the test data signals (PASS and DATA_TST) or I/O data signals (DATA0 and DATA1) from being stored in the two-bit register 500. However, when the LOAD signal is pulsed high (and LOAD_ pulsed low) a pair of input signals (PASS/DATA_TST or DATA0/DATA1) are loaded into the two-bit register 500.

The output of gate T500 is coupled to the first bit latch 506. The first bit latch 506 includes two inverters (I504 and I506) and a CMOS transfer gate T504. The output of inverter I506 is coupled to the input of inverter I504. The output of inverter I504 is coupled to the input of inverter I506 by transfer gate T504. The transfer gate T504 is turned on when the READ_CLK signal is high. Thus, when the READ_CLK signal is high, the inverters I504 and I506 form a latch.

The output of gate T502 is coupled to the second bit latch 508. The second bit latch 508 is similar to the first bit latch 506, and includes two inverters (I508 and I510) and a CMOS transfer gate T506 in the same general configuration as the first bit latch 506. The second bit latch 508 differs from the first bit latch 506 in that the transfer gate T506 is turned on when the READ_CLK signal is low.

The phased output circuit 510 is shown to include a first CMOS output transfer gate T508 and a second CMOS output transfer gate T510. Transfer gate T508 couples the output of the first bit latch 506 to a register output 514, and transfer gate T510 couples the output of the second bit latch 508 to the register output 514. The phased output circuit 510 is considered "phased" because transfer gate T508 is turned on when the READ_CLK signal is high, while transfer gate T510 is turned on when the READ_CLK signal is low.

Figure 5B:
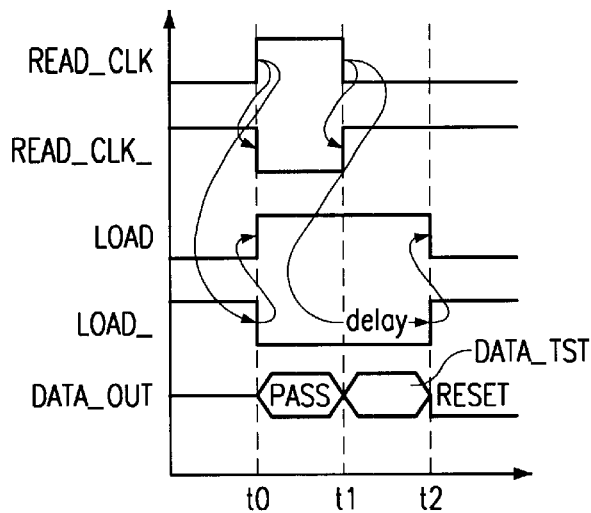
FIG. 5B is a timing diagram illustrating selected timing signals for the two-bit register of FIG. 5A.

FIG. 5B is a timing diagram illustrating the relationship between the READ_CLK, READ_CLK_, LOAD and LOAD_ signals. In addition, the value provided by the register output DATA_OUT in a test operation is also set forth. The operation of the two-bit register circuit 500 of FIG. 5A will be described in conjunction with FIG. 5B. At time t0, the READ_CLK signal is driven high, initiating the output of the PASS and DATA_TST values. When the READ_CLK signal goes high, the READ_CLK_ signal is driven low. This results in transfer gate T504 and T508 turning on, enabling the first bit latch 506, and coupling the first bit latch 506 to the register output 514. At the same time, the READ_CLK and READ_CLK_ values turn off transfer gates T506 and T510, disabling the second bit latch 508, and isolating the second bit latch 508 from the register output 514.

Also at time t0, in response to the high-going READ_CLK signal, the timing circuit 502 drives the LOAD signal high and the LOAD_ signal low. Transfer gates T500 and T502 are both turned on, enabling the load gate circuit 504. This allows the PASS value to be coupled and latched in the first bit latch 506. Because transfer gate T508 is turned on, the latched PASS value is coupled (in an inverted form) to the register output 514. In this manner, at the start of the READ_CLK pulse, the DATA_OUT signal will provide the PASS value.

At time t1, the READ_CLK signal returns low, driving the READ_CLK_ signal high. The LOAD signal remains high (and the LOAD_ signal remains low), thus, the load gate circuit 504 continues to provide the PASS and DATA_TST values to the two-bit register circuit 500. Transfer gate T504 is turned off, disabling the first bit latch 506, and isolating the first bit latch 506 from the register output 514. At the same time, transfer gates T506 and T510 are turned on, and the DATA_TST signal is latched in the second bit latch 508 and output (in an inverted form) to the register output 514. In this manner, following the termination of the READ_CLK pulse, the DATA_OUT signal will provide the DATA_TST value.

At time t2, the LOAD signal returns low and the LOAD_ signal returns high a given delay after the termination of the READ_CLK pulse. The delay is established by the delay circuit 512. The values of the LOAD and LOAD_ signals at time t2 establish a reset condition. With the LOAD signal low and the LOAD_ signal high, the load gate circuit 504 is disabled, preventing the PASS and DATA_TST signals from being loaded into the two-bit register circuit 500. In addition, the low LOAD signal results in transistors P500 and P502 being turned on, drawing the inputs of the first and second bit latch (506 and 508) to the high (VCC) level.

Because transfer gates T510 remains on, the high input to the second bit latch 508 is inverted by inverter I508, and results in low register output 514. Thus, in the reset condition, the DATA_OUT signal is low.

It is noted that in the preferred two-bit register 500, inverters I504 and I510 are CMOS inverters. In order to ensure the reset condition can be achieved without data contention between the p-channel transistors P500 and P502 and their associated latch inverters (I504 and I510, respectively), the n-channel transistors within inverters I504 and I510 have non-standard gate lengths.

Figure 6:
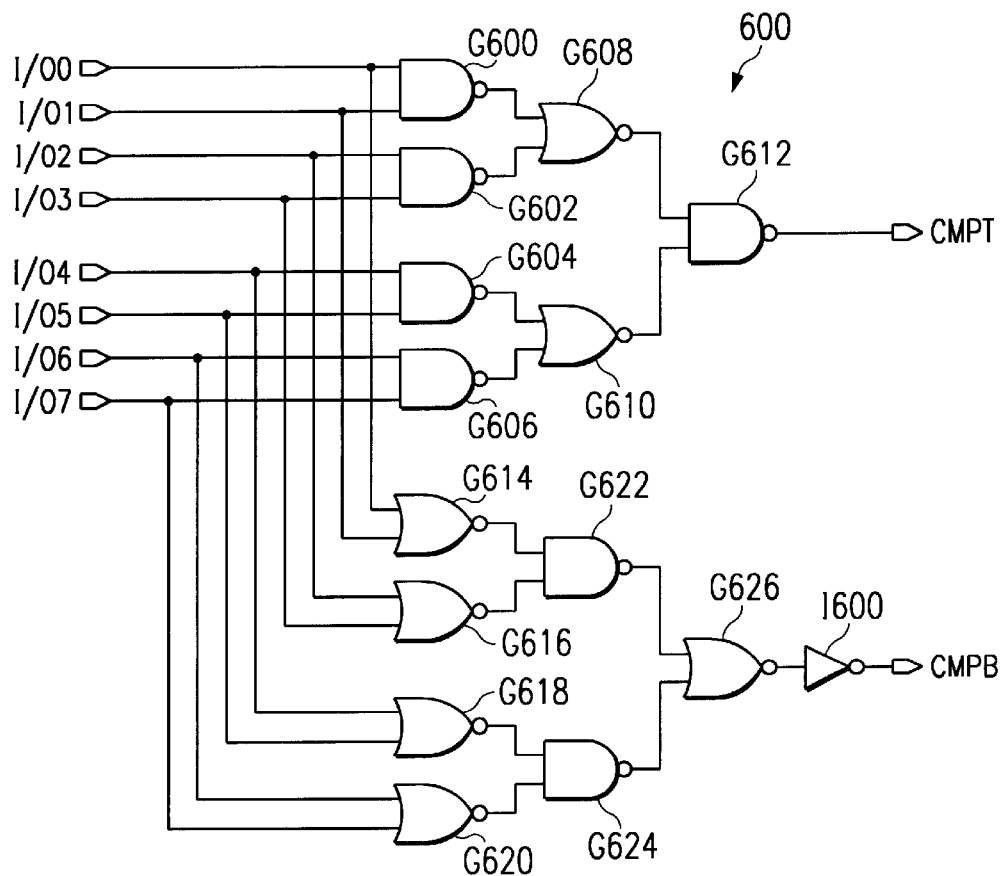
FIG. 6 is a schematic diagram illustrating a compress circuit that may be used in the embodiments.

Referring now to FIG. 6, a schematic diagram is set forth illustrating a compress circuit that may be used in the first embodiment 500. The compress circuit is designated by the general reference character 600, and includes a "high" compare path and a "low" compare path. The high compare path includes four two-input NAND gates (G600, G602, G604 and G606), each of which receives two different I/O lines as inputs, two two-input NOR gates (G608 an G610), and a two-input NAND gate G612. NOR gate G608 receives the outputs of NAND gates G600 and G602 as inputs. NOR gate G610 receives the outputs of NAND gates G604 and G606 as inputs. The outputs of gates G608 and G610 are provided as inputs to gate G612.

With the high compare path arrangement, if all of the I/O lines (I/O0–I/O7) are high, the outputs of gates G600, G602, G604 and G606 will all be low. With the inputs of gates G608 and G610 are all low, the outputs of gates G608 and G610 will be high. With two high inputs, the output of gate G612 (and hence the CMPT signal) will be low. In this manner, a low CMPT signal indicates that all of the I/O line values are high. In contrast, in the event at least one of the I/O lines (I/O0–I/O7) is low, the output of at least one of the gates G600, G602, G604 or G606, will be high. This will cause the output of at least one of the gate G608 or G610 to be low. With at least one low input, the output of gate G612 (the CMPT signal) will be high. In this manner, a high CMPT signal indicates that at least one of the I/O lines (I/O0–I/O7) is low, meaning that a test for all high outputs has failed, or that all of the outputs are low.

The low compare path includes four two-input NOR gates (G614, G616, G618 and G620), each of which receives two different I/O lines as inputs. A NAND gate G622 receives the outputs of NOR gates G614 and G616 as inputs. Another NAND gate G624 receives the outputs of NOR gates G618 and G620 as inputs. The outputs of gates G622 and G624 are provided as inputs to a two-input NOR gate G626. The output of gate G626 is inverted by an inverter I600 to generate the CMPB signal.

With the low compare path arrangement, if all of the I/O lines (I/O0–I/O7) are low, the outputs of gates G614, G616, G618 and G620 will all be high. With the inputs of gates G622 and G624 all high, the outputs of gates G622 and G624 will be low. With two low inputs, gate G626 will be driven high. This high value will be inverted by inverter I600 to generate a low CMPB signal. In this manner, a low CMPB signal indicates that all of the I/O line values are low. In contrast, in the event at least one of the I/O lines (I/O0–I/O7) is high, the output of at least one of the gates G614, G616, G618 or G620, will be low. This will cause the output of at least one of the gates G622 or G624 to be high. With at least one high input, the output of gate G626 will be low. This low value is inverted by inverter I600 to generate a high CMPB value. In this manner, a high CMPB signal indicates that at least one of the I/O lines (I/O0–I/O7) is high, meaning that a test for all low outputs has failed, or that all of the I/O lines were high.

Figure 7:
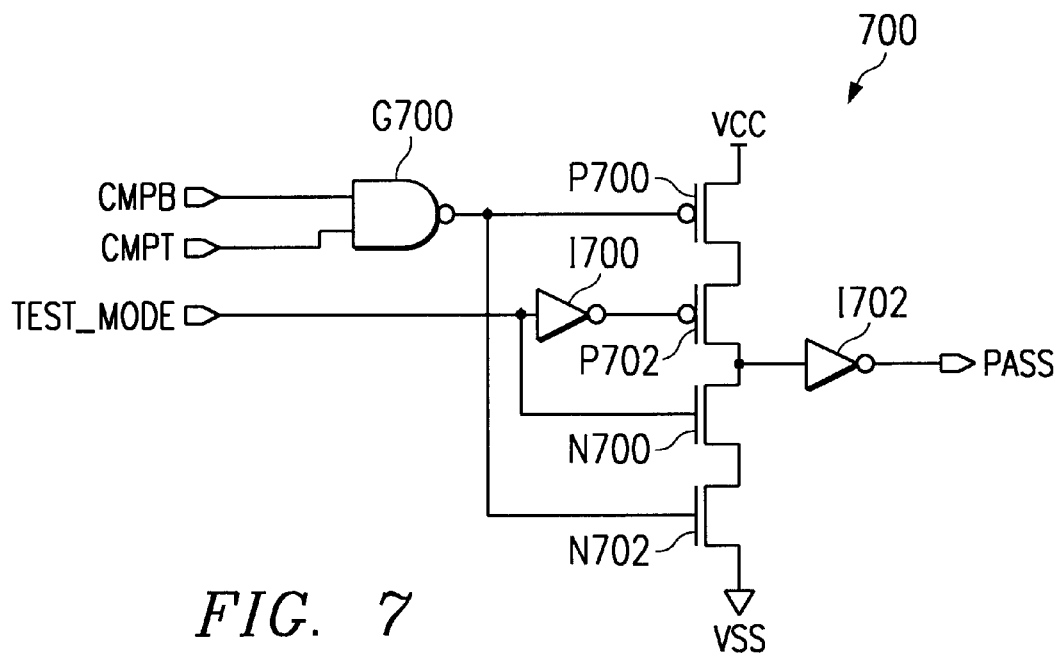
FIG. 7 is a schematic diagram illustrating a pass/fail circuit that may be used in the embodiments.

Referring now to FIG. 7, a schematic diagram is set forth for illustrating pass/fail circuit that may be used as the pass/fail circuit shown as item 322 in the first embodiment 300. The pass/fail circuit is designated by the general reference character 700 and is shown to include two p-channel MOS transistors (P700 and P702) arranged in series with two n-channel MOS transistors (N700 and N702). A two-input NAND gate G700 receives the CMPT and CMPB signals as inputs, and has an output coupled the gates of transistors P700 and N702. The TEST_MODE signal is applied directly to the gate of transistor N700, and by way of an inverter I700, to the gate of transistor P702. The drain-drain connection of transistors P702 and N700 is provided as an input to an inverter I702. The output of inverter I702 is the PASS signal.

In operation, the pass/fail circuit 700 is enabled by the TEST_MODE signal being high, which turns on transistors P702 and N700. Once enabled, the PASS signal will be driven high or low depending upon the composition of the CMPB and CMPT signals. In particular, in the event the CMPB and CMPT signals are different (one high and one low) the output of gate G500 will be high, resulting in the PASS signal being high. If however, the CMPB and CMPT signals are both high, the output of gate G500 will be low, resulting in the PASS signal going low.

Figure 8:
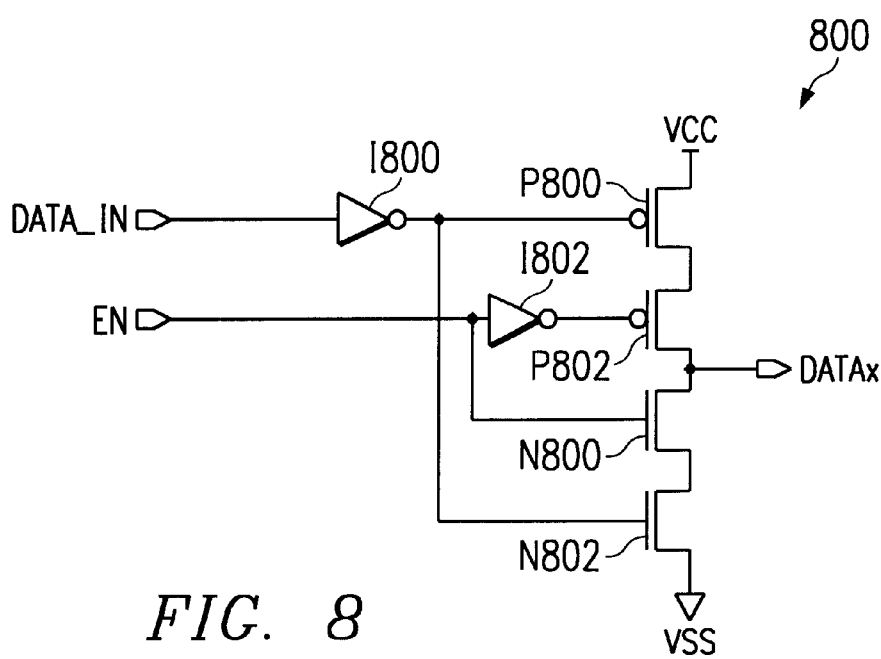
FIG. 8 is a schematic diagram illustrating a data state circuit that may be used in the embodiments.

FIG. 8 sets forth one example of a data state driver circuit that may be used in the first embodiment 300. The data state circuit of FIG. 8 may be used as the first data state circuit 310a, the second data state circuit 310b, or the test data state circuit 320. Thus, the data state driver will be discussed in terms of two input signals, DATA_IN and EN, and a resulting output signal DATAx. In the case of the first data state circuit 310a, the DATA_IN input, the EN input and DATAx output can be considered to correspond to the I/O1 line, the STD_EN signal, and DATA1 signal, respectively. Similarly, for the second data state circuit 310b, the DATA_IN input, the EN input and DATAx output can be considered to correspond to the I/O0 line, the STD_EN signal, and DATA0 signal, respectively. For the test data state circuit 320, the DATA_IN input, the EN input and DATAx output can be considered to the correspond to the CMPB signal, the TEST_MODE signal, and DATA_TST signal, respectively.

In FIG. 8, the data state circuit is designated by the general reference character 800 and is shown to include two p-channel MOS transistors (P806 and P802) arranged in series with two n-channel MOS transistors (N800 and N802). An inverter I800 receives the DATA_IN input, and has an output coupled to the gates of transistors P800 and N802. The EN input is coupled directly to the gate of transistor N800, and by way of an inverter I802, to the gate of transistor P802. The drain-drain connection of transistors P802 and N800 provides the DATAx output.

In operation, the data state circuit 800 is enabled by the EN input being high, which turns on transistors P802 and N800. When enabled, the DATAx output logic level will be driven high or low depending upon the value of the DATA_IN input. For example, when the DATA_IN signal is high, transistor P800 will be turned on and transistor N802 will be turned off, driving the DATAx output high. Conversely, when the DATA_IN signal is low, transistor P800 will be turned off and transistor N802 will be turned on, driving the DATAx output low.

While the first embodiment 300 can be used advantageously with an open drain type output driver, the teachings of the first embodiment 300 can be employed in semiconductor devices utilizing other types of output drivers. As just one example, a second embodiment is set forth in FIG. 9, and illustrates a semiconductor memory device having a parallel test mode and a CMOS output driver. The second embodiment provides test result data as a serial arrangement of test data bits, rather than placing an output (DQ) into one of three states.

The second embodiment is designated by the general reference character 900, and is shown to include many of the same circuit constituents as the first embodiment 300. To that extent, like circuit constituents will be referred to by the same reference characters as FIG. 3, but with the first numeral being a "9" instead of a "3." Thus, if reference is made to FIG. 9, the second embodiment 900 has the same arrangement as the first embodiment 300, but instead of an open drain output driver, the second embodiment includes a CMOS output driver 924.

The second embodiment 900 also differs from the first embodiment in that it includes a two-bit register 926 that differs from that of the first embodiment 300. Like the first embodiment 300, the two-bit register 926 of the second embodiment 900 receives a two-bit combination having a value that depends upon the mode of operation. In a standard mode of operation, a DATA0 and DATA1 signal are received, each reflecting the value the of two I/O lines. In a test mode of operation, a PASS and DATA_TST value are received, reflecting the results of a test operation. However, unlike the two-bit register 312 of FIG. 3, the two-bit register 926 of FIG. 9 does not invert the values. This occurs because the open drain output driver 314 of the first embodiment 300 functions as an inverting driver, while the CMOS output driver 924 functions as a non-inverting driver. In response to a READ_CLK pulse, the two-bit register 926 provides its two input values (DATA0/DATA1 or PASS/DATA_TST) in a serial fashion.

The CMOS output driver circuit 924 receives the register output (DATA_OUT) as well as the OE0 signal. When the OE0 signal is high, the CMOS output driver circuit 924 will drive the data output (DQ) according to the value of the DATA_OUT signal. When the OE0 signal is low, the output driver circuit 924 will be placed in a hi-Z state. In this manner, the CMOS output driver 924 is capable of providing three states; a logic high, a logic low, or a hi-Z state. It is noted, however, that all three states are not used to indicate test results.

Figure 9:
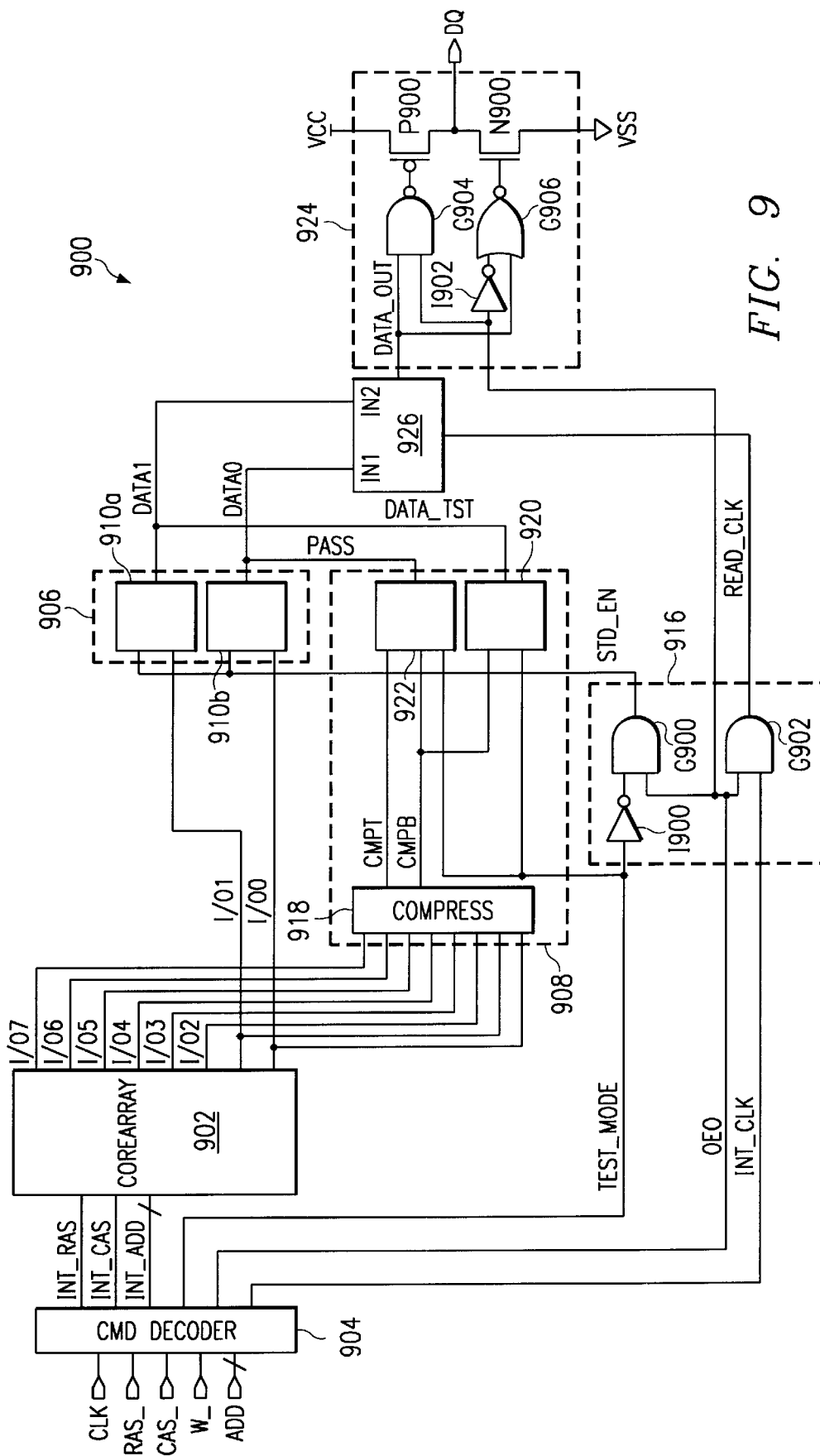
FIG. 9 is a block schematic diagram of a second embodiment.

The CMOS output driver 924 of FIG. 9 is shown to include a CMOS driver stage having a p-channel MOS transistor P900 and an n-channel MOS transistor N900 having source-drain paths arranged in series. The gate of transistor P900 is driven by a two-input NAND gate G904. The NAND gate G904 receives the DATA_OUT signal as one input and the OE0 signal as the other input. The gate of transistor N900 is driven by the two-input NOR gate G906. The NOR gate G906 receives the DATA_OUT signal as one input. For a second input, gate G906 receives the OE0 signal as inverted by an inverter 1902.

It is noted that the compress circuit 600 set forth in FIG. 6, the pass/fail circuit 700 set forth in FIG. 7, and the data state circuit 800 set forth in FIG. 8, may be used in the second embodiment 900.

Figure 10:
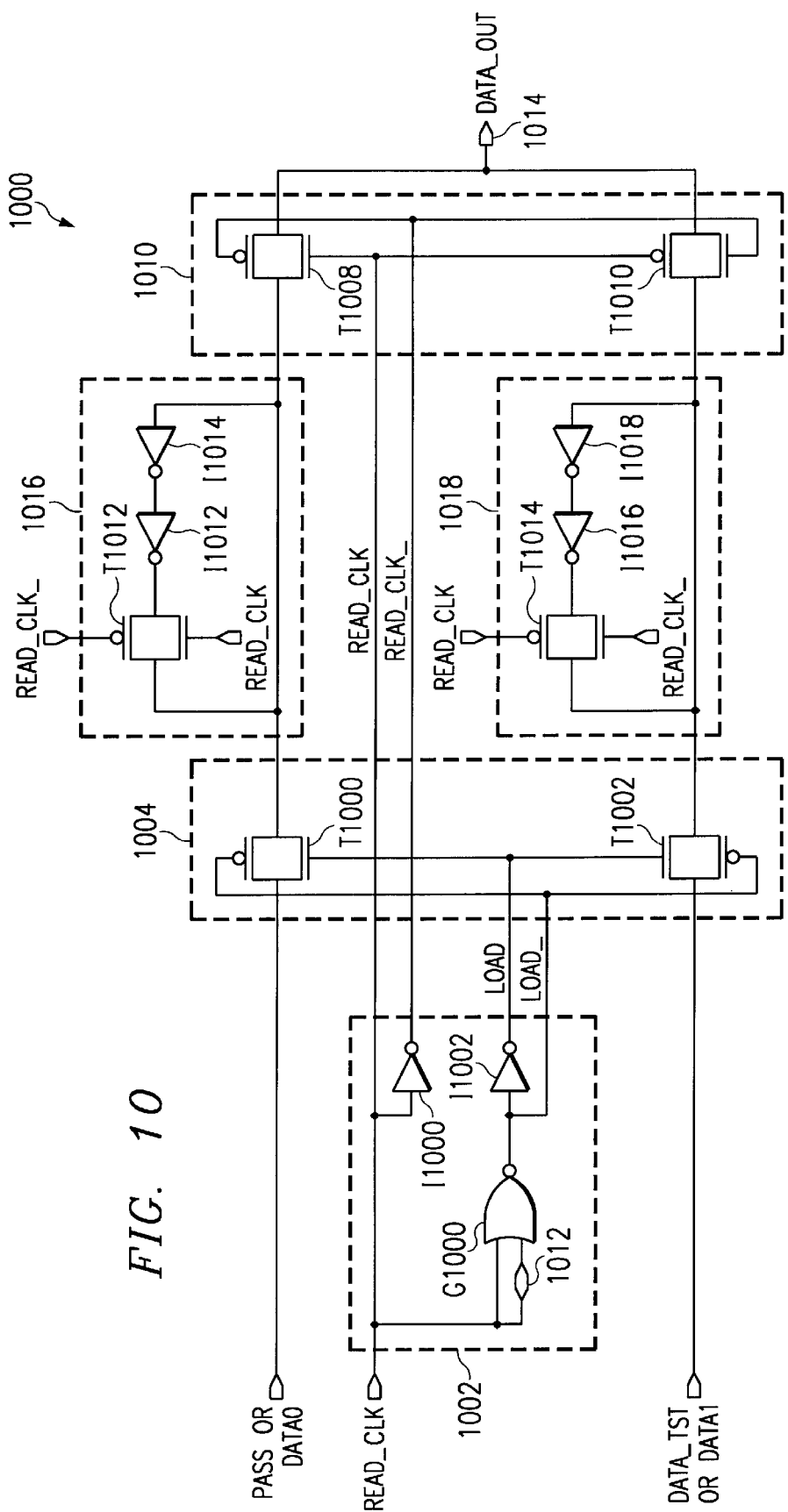
FIG. 10 is a schematic diagram illustrating a two-bit register that may be used in the second embodiment.

Referring now to FIG. 10, a two-bit register is set forth in a schematic diagram. The two-bit register may be utilized in the second embodiment 900. The two-bit register is designated by the general reference character 1000, and is shown to include many of the circuit constituents of FIG. 5A. To that extent, like circuit constituents will be referred to the same reference character, but with the first numeral being a "10" instead of "5." Thus, as set forth in FIG. 10, the two-bit register 1000 is shown to receive the READ_CLK signal and a pair of input values (DATA0/DATA1 or PASS/DATA_TST). A timing circuit 1002 provides the same general timing pulses (READ_CLK, READ_CLK_, LOAD and LOAD_) as the timing circuit of FIG. 5A. A load gate circuit 1004 loads data values in response to the LOAD and LOAD_ signals. A phased output gate circuit 1010 provides one data value (DATA0 or PASS) when READ_CLK signal is high, and another when the READ_ CLK signal is low (DATA1 or DATA_TST).

The two-bit register 1000 of FIG. 10 differs from that of FIG. 5A in that it includes a first bit latch 1016 and second bit latch 1018 that do not invert their received values. In particular, the first bit latch 1016 includes two inverters I1012 and I1014 connected in series from the output of transfer gate T1000. The output of inverter I1012 is connected back to the output of transfer gate T1000 by a latch transfer gate T1012. Similarly, the second bit latch 1018 has the same general arrangement with respect to the output of transfer gate T1002, and includes two inverters (I1016 and I1018) and a latch transfer gate T1014. Furthermore, because in the second embodiment 900 includes a CMOS output driver 924 that is placed in a hi-Z state by the OE0 signal, the two-bit register 1000 does not have to be placed in a reset condition. Accordingly, the two-bit register 1000 does not include p-channel MOS transistors (such as P500 and P502, in FIG. 5A) for establishing a reset condition.

The operation of the two-bit register 1000 of FIG. 10 has similarities to that set forth in FIG. 5A and FIG. 5B. When the READ_CLK signal pulses high the LOAD signal pulses high, and data values are coupled into the two-bit register 1000. Transfer gate T1008 is on, resulting in data being latched in the first bit latch 1016 and output at register output 1014.

Transfer gate T1010 is turned off, isolating the value in the second bit latch 1018 from the register output 1014. When the READ_CLK returns low, due to the delay established by delay circuit 1012, the LOAD signal remains high. Transfer gate T1008 is turned off isolating the first bit latch 1016 from the register output 1014. At the same time, however, the second bit latch 1018 is enabled and the second bit latch 1018 latches this value. Transfer gate T1010 is turned on, outputting the value of the second bit latch 1018.

Although the present invention has been described in terms of detailed dynamic random access memory (DRAM) embodiments, the teachings set forth herein may be applicable to other types of semiconductor devices having a test arrangement that compresses test data, and provides the test data at an output. Furthermore, while the two embodiments provide two bits of test data, the teachings set forth herein could provide a larger number of test data bits, by increasing the size of the register. Accordingly, it should be understood that various changes, substitutions, and alterations could be made without departing from the spirit and scope of the invention as defined by the appended claims.

What is claimed is:

1. A test circuit for a semiconductor device, comprising:
    a test circuit that receives a number of data signals and compares the data signals to predetermined values to generate a plurality of test data values;
    a register that receives the test data values in parallel, and provides the test data values in a sequential fashion at a register output;
    an output driver coupled to an output node, the output driver receiving the sequential test data values, and establishing logic values at the output node in a sequential fashion according to the test values.

2. The test circuit of claim 1, wherein:
    the output driver establishes two logic values at the output node, a first logic value is established by presenting a high impedance state to the output node, and a second logic value is established by driving the output node to a first logic potential.

3. The test circuit of claim 1, wherein:
    the output driver establishes two logic values at the output node, a first logic value is established by driving the output to a first voltage, and a second logic value is established by driving the output node to a second voltage.

4. In a semiconductor memory device having an open drain driver circuit, a parallel test circuit comprising:
    a memory cell array;
    a plurality of input/output (I/O) lines coupled to the memory cell array;
    a test circuit coupled to a plurality of I/O lines, the test circuit including compare logic that compares logic values on the I/O lines to predetermined logic values to generate at least a first test value and a second test value;
    an output driver circuit coupled to an output node, the output driver circuit having a controllable impedance path coupled between the output node and a first logic voltage, the output driver placing the controllable impedance path in a high impedance state when a first logic value is received at a driver input, and a low impedance state when a second logic value is received at the driver input;
    a register that receives a control clock, the register having a first latch coupled to the first test value,
    a second latch coupled to the second test value, and
    a phased output circuit that couples the first latch to the driver input on a first control clock value, and couples the second latch to the driver input on a second control clock value.

5. The parallel test circuit of claim 4, wherein:
    the first test value indicates the polarity of the I/O lines and the second test value indicates if the I/O line values match predetermined logic values.

6. The parallel test circuit of claim 4, wherein:
    the register further includes
    the first latch being coupled to the first test value in a test mode and to one of the I/O lines in a standard mode, and
    the second latch being coupled to the second test value in the test mode and to another of the I/O lines in the standard mode.

* * * * *